(12) United States Patent
Jang et al.

(10) Patent No.: US 10,738,381 B2
(45) Date of Patent: Aug. 11, 2020

(54) THIN FILM DEPOSITION APPARATUS

(71) Applicant: ASM IP Holding B.V., Almere (NL)

(72) Inventors: Hyun Soo Jang, Daejeon (KR); Jeong Ho Lee, Seoul (KR); Woo Chan Kim, Daejeon (KR); Sung Hoon Jun, Bucheon-si (KR); Jong Won Shon, Seoul (KR)

(73) Assignee: ASM IP Holding B.V., Almere (NL)

( * ) Notice: Subject to any disclaimer, the term of this patent is extended or adjusted under 35 U.S.C. 154(b) by 964 days.

(21) Appl. No.: 15/232,603

(22) Filed: Aug. 9, 2016

(65) Prior Publication Data

US 2017/0044666 A1 Feb. 16, 2017

(30) Foreign Application Priority Data

Aug. 13, 2015 (KR) .......................... 10-2015-0114564
Jun. 14, 2016 (KR) .......................... 10-2016-0073841

(51) Int. Cl.
*C23C 16/44* (2006.01)
*C30B 25/12* (2006.01)
*C23C 16/458* (2006.01)

(52) U.S. Cl.
CPC ...... *C23C 16/4409* (2013.01); *C23C 16/4581* (2013.01); *C30B 25/12* (2013.01)

(58) Field of Classification Search
CPC .. C23C 16/4409; C23C 16/4581; C30B 25/12
See application file for complete search history.

(56) References Cited

U.S. PATENT DOCUMENTS

| 6,539,891 | B1 | 4/2003 | Lee et al. |
| 2003/0114016 | A1* | 6/2003 | Tischler ............ H01L 21/68771 |
| | | | 438/758 |
| 2007/0186853 | A1* | 8/2007 | Gurary ................ C23C 16/4586 |
| | | | 118/720 |

(Continued)

FOREIGN PATENT DOCUMENTS

| CN | 1689141 A | 10/2005 |
| CN | 102753727 A | 10/2012 |

(Continued)

OTHER PUBLICATIONS

Office Action dated May 2, 2018 in related Chinese Application No. 201610654003.6.

(Continued)

*Primary Examiner* — Kambiz Zand
*Assistant Examiner* — Mirza Israr Javed
(74) *Attorney, Agent, or Firm* — Knobbe, Martens, Olson & Bear LLP

(57) ABSTRACT

Disclosed are a substrate holder and a semiconductor manufacturing apparatus including the substrate holder. The substrate holder provides a reaction region by making face-sealing contact with a reactor wall. The substrate holder has an elastic behavior when pressure is applied thereto while the substrate holder makes face-sealing contact with the reactor wall. The semiconductor manufacturing apparatus includes the substrate holder and a gas supply unit configured to supply gas to the reaction region provided by the reactor wall and the substrate holder.

19 Claims, 18 Drawing Sheets

(56) References Cited

U.S. PATENT DOCUMENTS

2007/0209590 A1* 9/2007 Li .................. C23C 16/4401
                                                            118/719
2014/0072726 A1    3/2014  Kim
2014/0345523 A1   11/2014  Kikuchi et al.

FOREIGN PATENT DOCUMENTS

TW        201515134 A    4/2015
WO   WO 2011/125704 A1  10/2011

OTHER PUBLICATIONS

Office Action issued for related Taiwanese Patent Application No. 105121757 dated Feb. 17, 2017.

* cited by examiner

THIN FILM DEPOSITION APPARATUS

CROSS-REFERENCE TO RELATED APPLICATION

This application claims the benefit of Korean Patent Application No. 10-2015-0114564, filed on Aug. 13, 2015 in the Korean Intellectual Property Office, and No. 10-2016-0073841, filed on Jun. 14, 2016 in the Korean Intellectual Property Office, the disclosure of which is incorporated herein in its entirety by reference.

BACKGROUND

1. Field

One or more embodiments relate to a substrate holder and a semiconductor manufacturing apparatus (such as a thin film deposition apparatus) including the substrate holder.

2. Description of the Related Art

Recently, the line width of semiconductor circuits has been decreased to twenty or twenty-plus nanometers (nm), and thus, it is necessary to deposit very thin films on silicon substrates and tighten the conditions for thin film deposition processes. In addition, it is necessary to increase the throughput of systems or processes to realize commercial mass production.

Deposition reactors having various shapes and configurations have been developed to obtain high throughput. For example, batch type reactors capable of accommodating several tens of substrates and semi-bath type reactors capable of accommodating at least two substrates in a horizontal direction have been developed. Semi-batch type reactors have been improved in various ways. Examples of such semi-batch type reactors include space-division type reactors and multiple reactor apparatuses. In the case of space-division type reactors, a plurality of substrates are placed on a substrate holder such as a susceptor and thin films are deposited on the substrates while the substrate holder is being rotated. In the case of multiple reactor apparatuses, a plurality of individual reactors are arranged in a vacuum chamber.

Multiple reactor apparatuses allow relatively precise process control of individual substrates and a plurality of substrates can be processes at the same time. Thus, multiple reactor apparatuses have been recently widely used in processes of manufacturing highly integrated devices.

However, gas leakage that occurs when multiple reactor apparatuses are used leads to various problems during processes performed in the multiple reactor apparatuses. For example, the supply of sources and reaction gases to substrates may be disturbed, and thus, processes may be negatively affected. In addition, corrosion of outer chamber components and a decrease in the lifespan of process equipment may occur.

The inventor has found that a top lid of an outer chamber is one of the factors causing a gas leakage. For example, the upper portion of an outer chamber in which bodies of individual reactors are arranged may be deformed by the weight of a top lid of the outer chamber, and this deformation may have a negative influence on processes and the structures of the individual reactors.

SUMMARY

According to one or more embodiments, the above-mentioned problems (such as the deformation of an outer chamber of a multiple reactor apparatus, which negatively affects the individual reactors) may be prevented or reduced.

Additional aspects will be set forth in part in the description which follows and, in part, will be apparent from the description, or may be learned by practice of the presented embodiments.

According to one or more embodiments, a substrate holder includes: a substrate rest; and a stepped portion surrounding the substrate rest, wherein at least one of a lateral side and a lower portion of the stepped portion includes a recess region.

The recess region may be provided in the lateral side of the stepped portion and may include a groove extending into the lateral side.

The stepped portion may include an upper step and a lower step having a height different from a height of the upper step, and the groove may have a width greater than a width of the lower step.

An upper surface of the lower step may extend in a direction parallel with a direction in which the groove extends. Alternatively, the upper surface of the lower step may extend in a direction not parallel with a direction in which the groove extends.

The upper surface of the lower step may extend in an inclined direction toward an extended surface of an upper surface of the upper step from a position at which the upper surface of the lower step is stepped from the upper step.

The recess region may be provided in the lower portion of the stepped portion and may extend along the lower portion of the stepped portion.

The recess region may have a width greater than a width of the stepped portion.

An elastic material may be filled in at least a portion of the recess region.

According to one or more embodiments, a substrate holder configured to make face-sealing contact with a reactor wall includes: a substrate accommodation region; and a contact region surrounding the substrate accommodation region and making face-sealing contact with the reactor wall, wherein the contact region has an elastic behavior when pressure is applied thereto from the reactor wall during the face-sealing contact.

At least one of a lateral side and a lower portion of the contact region may have a recessed shape.

According to one or more embodiments, a semiconductor manufacturing apparatus includes: a reactor wall; a substrate holder configured to make face-sealing contact and define a reaction region with the reactor wall; and a gas supply unit configured to supply gas to the reaction region, wherein the substrate holder has an elastic behavior when pressure is applied thereto from the reactor wall during the face-sealing contact.

A space may be formed between the substrate holder and the reactor wall during the face-sealing contact.

At least a portion of the substrate holder may include an upper step and a lower step having a height different from a height of the upper step, and the space may be formed between the upper step and the reactor wall during the face-sealing contact.

The semiconductor manufacturing apparatus may further include an outer chamber surrounding the reactor wall, wherein the pressure applied to the substrate holder during the face sealing contact may be generated by the outer chamber.

The substrate holder may include a groove extending into a lateral side of the substrate holder. Optionally, the groove may extend into a region overlapping the reaction region.

A lower portion of the substrate holder may have a stepped shape. Optionally, the stepped shape may extend into a region overlapping the reaction region.

According to one or more embodiments, a semiconductor manufacturing apparatus includes: a first reactor wall; a second reactor wall; a gas supply unit configured to supply gas to a region inside the first reactor wall and a region inside the second reactor wall; an outer chamber surrounding the first reactor wall and the second reactor wall; a first substrate holder configured to move vertically and make face-sealing contact with the first reactor wall; and a second substrate holder configured to move vertically and make face-sealing contact with the second reactor wall, wherein at least one of the first and second substrate holders includes a stepped portion, and at least one of a lateral side and a lower portion of the stepped portion includes a recess region having an elastic behavior when pressure is applied thereto by the reactor wall during the face-sealing contact.

The substrate holder of the one or more of the above embodiments may further include at least one prop filling at least a portion of the recess region.

The prop may have a thermal expansion coefficient lower than a thermal expansion coefficient of the stepped portion. The at least one prop may have a plurality of props, and the props may be asymmetrically arranged along a circumference of the substrate holder.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
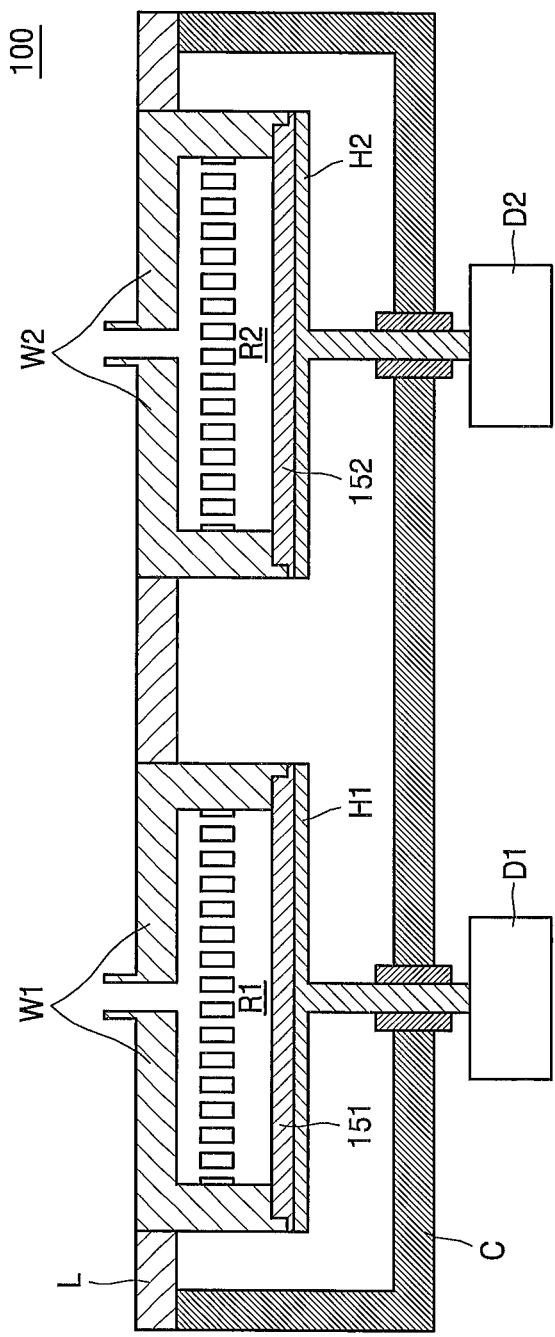
FIG. 1 is a cross-sectional view illustrating a semiconductor manufacturing apparatus configured as a multiple reactor apparatus.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Embodiments will now be described with reference to the accompanying drawings.

The inventive concept may, however, be embodied in many different forms and should not be construed as being limited to the embodiments set forth herein; rather, these embodiments are provided to give a clear understanding of the inventive concept to those of ordinary skill in the art. That is, the embodiments are provided so that this disclosure will be thorough and complete, and will fully convey the inventive concept to those of ordinary skill in the art.

In the following description, terms are used only for explaining specific embodiments while not limiting the inventive concept. The terms of a singular form may include plural forms unless referred to the contrary. The meaning of "comprise" and/or "comprising" specifies a shape, a fixed number, a step, a process, a member, an element, and/or a combination thereof but does not exclude other shapes, fixed numbers, steps, processes, members, elements, and/or combinations thereof. As used herein, the term "and/or" includes any and all combinations of one or more of the associated listed items.

It will be understood that, although the terms first, second, etc. may be used herein to describe various members, regions, and/or elements, these members, regions, and/or elements should not be limited by these terms. These terms are not used to denote a particular order, a positional relationship, or ratings of members, regions, or elements, but are only used to distinguish one member, region, or element from another member, region, or element. Thus, a first member, region, or element discussed below could be termed a second member, region, or element without departing from the teachings of the inventive concept.

Hereinafter, embodiments will be described with reference to the accompanying drawing. Shapes illustrated in the drawings may vary according to various factors such as manufacturing methods and/or tolerances. That is, the embodiments are not limited to the particular shapes illustrated in the drawings. Factors such as shape changes in manufacturing processes should be considered.

FIG. 1 is a cross-sectional view illustrating a semiconductor manufacturing apparatus 100 configured as a multiple reactor apparatus.

Referring to FIG. 1, the semiconductor manufacturing apparatus 100 may be, for example, a thin film deposition apparatus. The semiconductor manufacturing apparatus 100 may include a first reactor wall W1, a second reactor wall W2, a first substrate holder 151, a second substrate holder 152, a first heater H1, a second heater H2, a first driving unit D1, a second driving unit D2, and an outer chamber C including a top lid L. As shown in FIG. 1, the semiconductor manufacturing apparatus 100 includes two reactor walls, two substrate holders, two heaters, and two driving units. However, the inventive concept is not limited thereto. For example, the semiconductor manufacturing apparatus 100 may include three or more reactor walls, three or more substrate holders, three or more heaters, and three or more driving units.

The reactor walls (for example, the first reactor wall W1 and/or the second reactor wall W2) may be arranged in the outer chamber C to respectively form reaction regions (for example, a first reaction region R1 and/or a second reaction region R2).

For example, the reactor walls (such as the first reactor wall W1 and/or the second reactor wall W2) may make face-sealing contact with the substrate holders (such as the first substrate holder 151 and/or the second substrate holder 152) to respectively form reaction regions. The reactor walls may be fixed to the outer chamber C. For example, the first reactor wall W1 may be fixed to a lateral wall of the outer chamber C (not shown) or to the top lid L of the outer chamber C.

The substrate holders (for example, the first substrate holder 151 and/or the second substrate holder 152) may be arranged in the outer chamber C to hold reaction-target objects (for example, semiconductor substrates). As described above, the substrate holders (for example, the first substrate holder 151 and/or the second substrate holder 152) may be respectively brought into face-sealing contact with the reactor walls (for example, the first reactor wall W1 and/or the second reactor wall W2) so as to form the reaction regions (for example, the first reaction region R1 and/or the second reaction region R2).

The substrate holders (for example, the first substrate holder 151 and/or the second substrate holder 152) may be placed on the heaters (for example, the first heater H1 and/or the second heater H2). The heaters may be configured to heat the substrate holders. The heaters may be connected to the driving units of which driving shafts may be vertically moved. Thus, the substrate holders placed on the heaters may also be vertically moved. Selectively, the heaters may be formed in one piece with the substrate holders, respectively.

The multiple reactor apparatus may receive substrates and perform a reaction process as described below.

Figure 2:
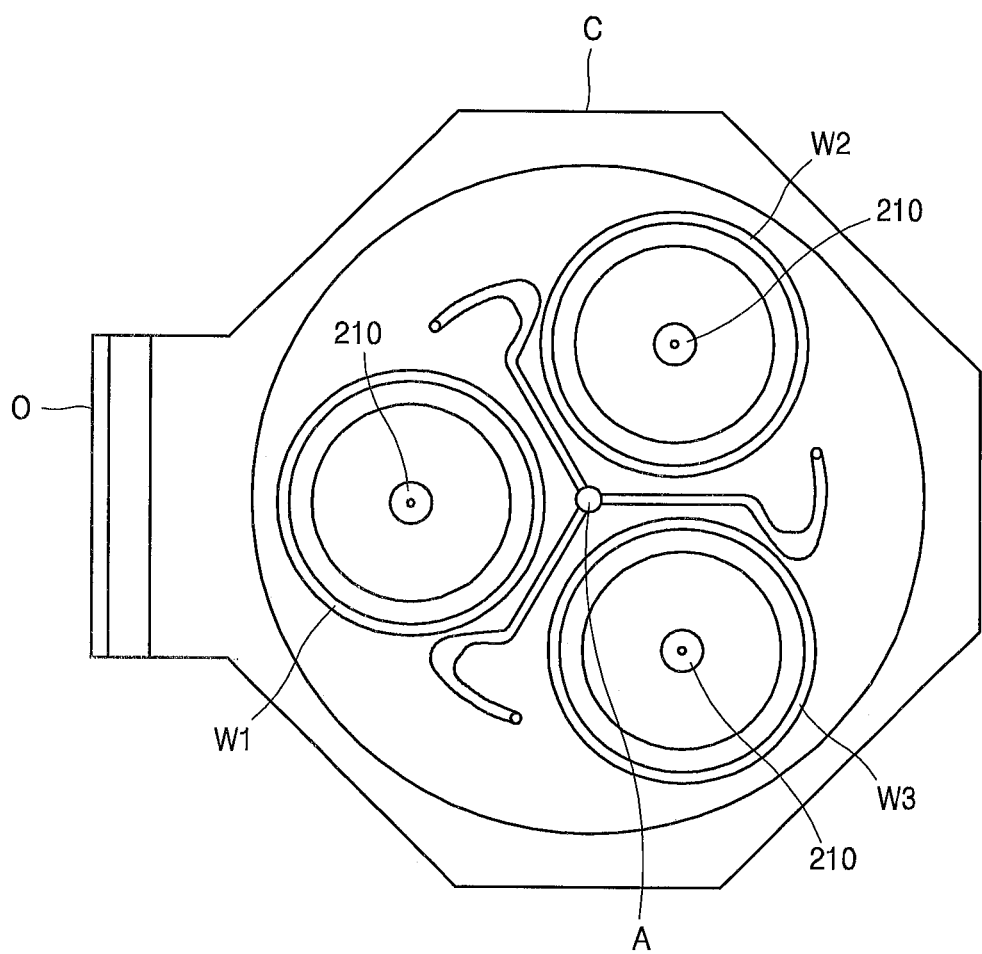
FIG. 2 is a view illustrating another example of a semiconductor manufacturing apparatus configured as a multiple reactor apparatus.

Another multiple reactor apparatus is illustrated in FIG. 2. Referring to FIG. 2, a transfer mechanism may be moved into an outer chamber C through an openable passage O to place substrates on a plurality of substrate holders. If the substrates are positioned right above the substrate holders such as susceptors, substrate support pins 210 may be lifted to pin-up positions through holes formed in the substrate holders (and heaters), and then, the substrates may be placed on the substrate support pins 210. Then, the substrate support pins 210 may be lowered to pin-down positions to place the substrates in accommodation regions of the substrate holders.

Thereafter, a vacuum may be formed in the outer chamber C or an inert gas such as argon (Ar) gas may be filled in the outer chamber C, and the substrate holders may be brought into contact with lower portions of reactor walls to form reaction regions. For example, driving units may lift the heaters and the substrate holders placed on the heaters, and then the substrate holders may be brought into surface contact with the reactor walls, thereby forming the reaction regions. Thereafter, raw materials may be supplied from a raw material supply unit to the substrates, and a semiconductor manufacturing process (such as a thin film deposition process) may be performed. After reactions, remaining materials may be discharged through outlets (such as exhaust holes) formed in upper or lower portions of the reactor walls.

The internal pressure of the outer chamber C may be set to be lower than the internal pressure of the reaction regions (reaction chambers). For example, the inside of the outer chamber C may be filled with an inert gas such as argon (Ar) gas, and the internal pressure of the reaction regions formed by the reactor walls and the substrate holders may be maintained to be slightly higher than the internal pressure of the outer chamber C. Thus, the inert gas filled in the outer chamber C may not permeate the reaction regions (reaction chambers), and a process may not be affected by the inert gas.

Different processes may be performed in the reaction chambers. For example, a transfer device such as a transfer arm A may be provided in the outer chamber C (for example, in a center region of the outer chamber C). In this case, if the reaction regions are opened by lowering the substrate holders and the heaters using the driving units, the substrates may be transferred between the reaction chambers using the transfer device. In this manner, various reaction processes may be performed on each substrate. For example, if various deposition processes are performed in the reaction chambers, various thin films may be sequentially formed on each substrate in the outer chamber C.

Figure 3:
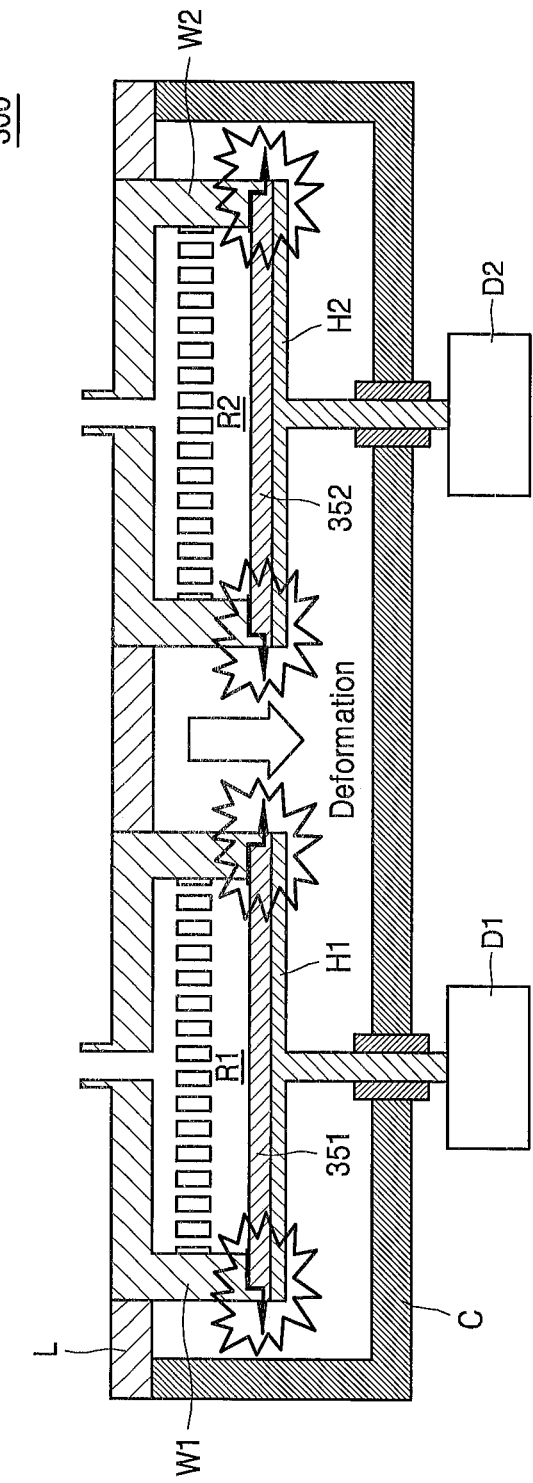
FIG. 3 is a view illustrating a gas leak in a semiconductor manufacturing apparatus configured as a multiple reactor apparatus.

FIG. 3 illustrates a gas leak in a semiconductor manufacturing apparatus 300 according to an embodiment. The semiconductor manufacturing apparatus 300 may be, for example, a multiple reactor apparatus.

If a face sealing method is used to form reaction regions R1 and R2 between substrate holders 351 and 352 and reactor walls W1 and W2, that is, by bringing the substrate holders 351 and 352 into contact with the reactor walls W1 and W2, gas may inevitably leak to an outer chamber C through a contact region. If such gas leakage increases, sources and reaction gases may not be sufficiently supplied to substrates during a process, and thus the process may be negatively affected. In addition, elements of the outer chamber C may corrode and the lifespan of process equipment may decrease, thereby having a negative influence on maintenance work.

The inventor found that a weight of a top lid L of the outer chamber C is one of the reasons causing such gas leakage. Referring to FIG. 3, the reactor walls W1 and W2 forming the reaction regions R1 and R2 are fixed to the top lid L of the outer chamber C, and the top lid L may deform downwardly due to its weight. In this case, the reactor walls W1 and W2 may be pushed downwardly, and thus the contact between the reactor walls W1 and W2 and the substrate holders 351 and 352 may become unstable.

This unstable contact may cause gas to leak from the reaction regions R1 and R2 (that is, cavities between the reactor walls W1 and W2 and the substrate holders 351 and 352) to the outer chamber C (refer to arrows in FIG. 3). In other words, due to the deformation of the top lid L, contact surfaces of the reactor walls W1 and W2 and the substrate holders 351 and 352 may mismatch one another, and thus, process gas may leak from the reaction regions R1 and R2 to the outer chamber C.

Figure 4:
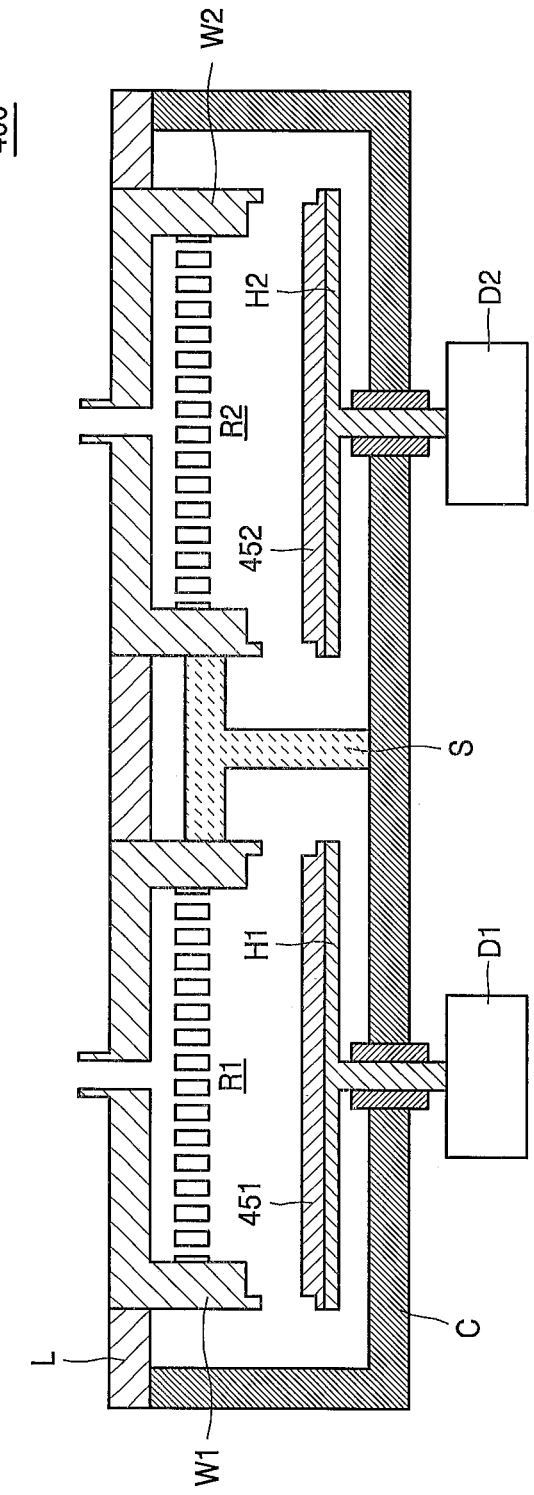
FIG. 4 is a schematic view illustrating a semiconductor manufacturing apparatus according to an embodiment.
Figure 5A:
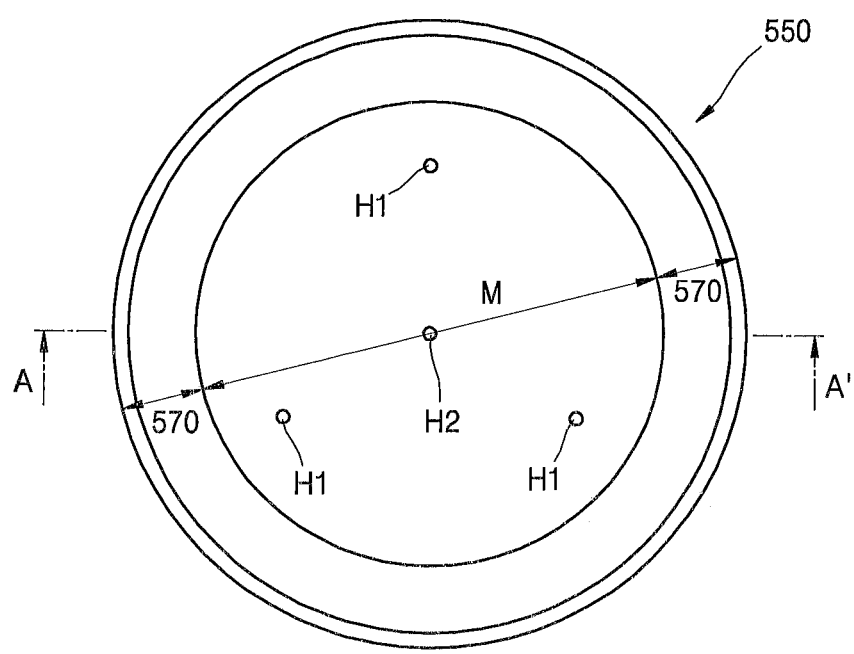
FIGS. 5A to 5D are schematic views illustrating a substrate holder according to an embodiment.
Figure 5B:
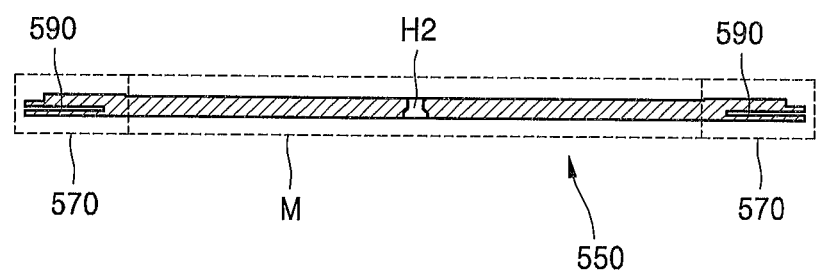
Figure 5C:
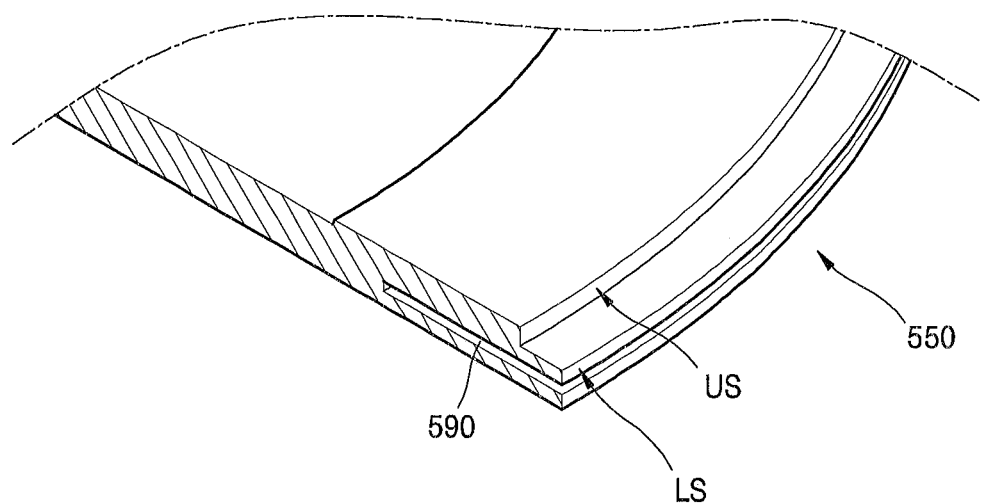
Figure 5D:
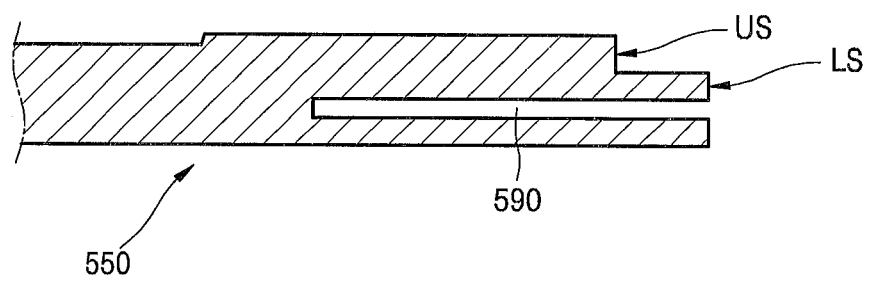

To prevent this, a support structure may be provided between the top lid L and the outer chamber C. For example, a support structure may be placed in a center region of the outer chamber C between the top lid L and the outer chamber C (or as shown in FIG. 4, a support structure S may be placed in a center region of the outer chamber C between the outer chamber C and the first and second reactor walls W1 and W2) so as to prevent deformation of the top lid L (and the reactor walls W1 and W2). However, such a support structure may block the movement of a transfer arm (refer to reference character A in FIG. 2) of a multiple reactor apparatus, and thus, the use of such a support structure is limited.

FIGS. 5A to 5D are schematic views illustrating a substrate holder 550 according to an embodiment.

Referring to FIGS. 5A to 5D, the substrate holder 550 is configured to make face-sealing contact with a reactor wall may include a substrate rest M and a stepped portion 570.

The substrate rest M is a region in which a substrate will be placed. Holes H1 for substrate support pins (not shown) and a hole H2 for a fixing pin (not shown) may be formed in the substrate rest M. The positions of the holes H1 and H2 may be changed.

The stepped portion 570 may surround the substrate rest M. For example, the stepped portion 570 may form an edge region of the substrate holder 550. The stepped portion 570 may be formed in a contact region making face-sealing contact with a reactor wall. The stepped portion 570 may include an upper step US and a lower step LS having a height different from the height of the upper step US.

A lateral side of the stepped portion 570 (for example, a lateral side of the lower step LS) may include a recess region 590. That is, the recess region 590 may be formed in the lateral side of the stepped portion 570 and may include a groove extending into the lateral side of the stepped portion 570. The groove may extend in parallel with a surface of the stepped portion 570 (for example, an upper surface of the upper step US and/or an upper surface of the lower step LS).

According to an embodiment, the stepped portion 570 is formed in a contact region making contact with a reactor wall. Therefore, during a process, reaction byproducts or pollutant particles generated from the reaction byproducts may not reversely move toward an upper surface of a substrate holder 550 (susceptor) on which a substrate is placed. Therefore, a thin film may be formed on the substrate with high quality.

Furthermore, according to an embodiment, the recess region 590 is formed in the lateral side of the stepped portion 570. Therefore, when the reactor wall contacts the stepped portion 570 and downwardly pushes the stepped portion 570, the recess region 590 may function as a buffer absorbing pressure acting on a surface contact region (for example, the edge region) of the substrate holder 550. As a result, even if a contact mismatch occurs between a reactor wall and the substrate holder 550 due to deformation of a top lid L, gas leakage may be prevented or reduced.

Figure 6:
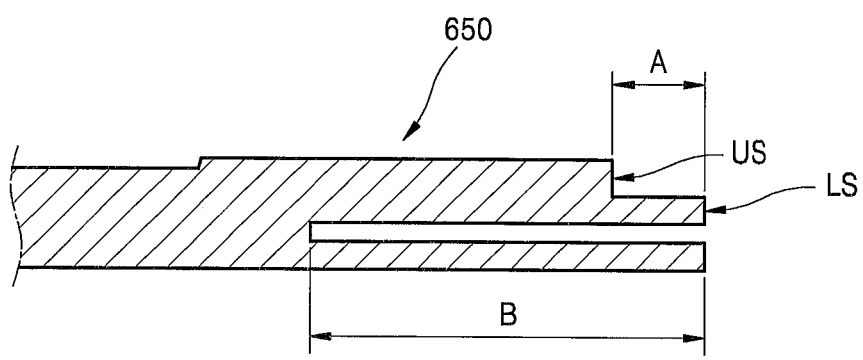
FIG. 6 is a schematic cross-sectional view illustrating a substrate holder according to an embodiment.

FIG. 6 is a schematic cross-sectional view illustrating a substrate holder 650 according to an embodiment.

Referring to FIG. 6, the substrate holder 650 may be a susceptor including the same material as that included in a heater. The material may be aluminum (Al). Therefore, heat may be transferred from the heater to the susceptor with less loss.

The susceptor may include a groove having a width greater than the width of a lower step LS. For example, the width of the lower step LS and the depth (width) of the groove may satisfy the condition A<B where A denotes a length measured from an edge of the susceptor to a position at which the lower step LS is stepped from an upper step US, and B denotes the depth of the groove.

The susceptor may include a ductile metallic material, and the depth (width) of the groove may be greater than the width of the lower step LS. In this case, pressure applied in a downward direction from an outer chamber (and a reactor wall) to the susceptor may be flexibly absorbed. Therefore, the formation of a fine gas leakage path between the susceptor and the reactor wall may be suppressed.

Figure 7:
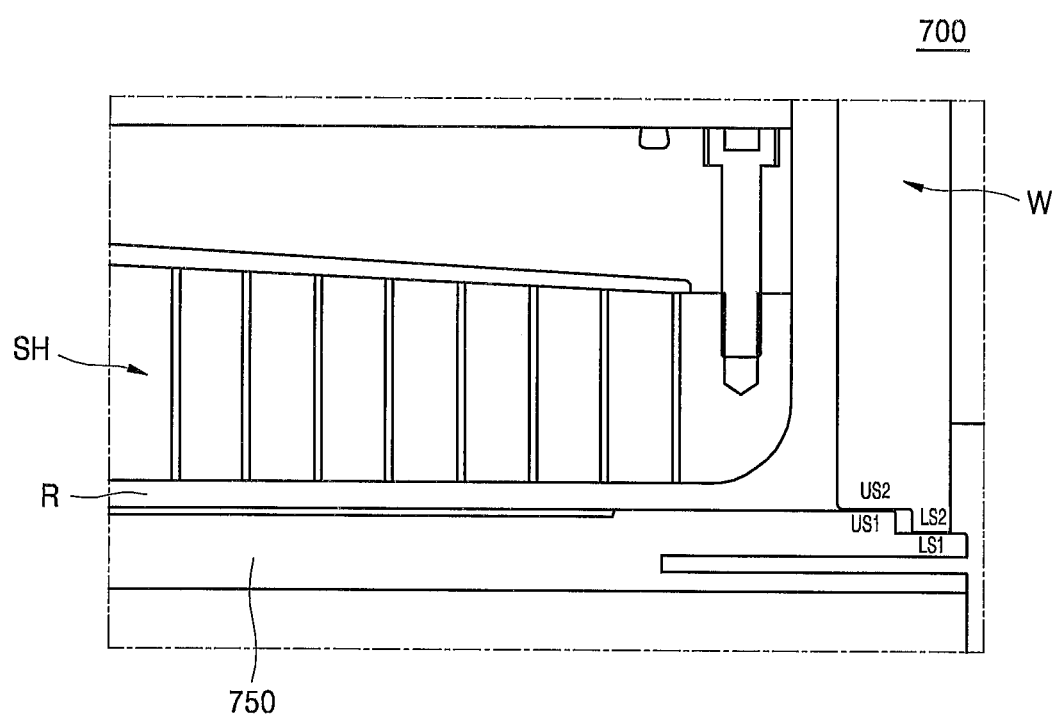
FIG. 7 is a schematic view illustrating a semiconductor manufacturing apparatus according to an embodiment.

FIG. 7 is a schematic view illustrating a semiconductor manufacturing apparatus 700 according to an embodiment. The semiconductor manufacturing apparatus 700 of the embodiment may include a substrate holder such as the substrate holders 550 and 650 of the previous embodiments. Thus, repeated descriptions thereof will be omitted.

Referring to FIG. 7, the semiconductor manufacturing apparatus 700 may include a reactor wall W, a substrate holder 750, and a gas supply unit SH.

The substrate holder 750 may be brought into face-sealing contact with the reactor wall W to form a reaction region R. For example, at least a portion of the substrate holder 750 may has a first stepped shape, and the reactor wall W may has a second stepped shape corresponding to the first stepped shape. Face sealing may be realized as the first stepped shape and the second stepped shape are brought into contact with each other.

The substrate holder 750 may have an elastic behavior when pressure is applied thereto by an outer chamber (and the reactor wall W) after face sealing is realized as described above. To this end, a groove may be formed in a lateral side of the substrate holder 750. The groove may extend into a region overlapping the reaction region R.

The gas supply unit SH may supply gas to the reaction region R. For example, the gas supply unit SH may be a showerhead type gas supply unit configured to supply reaction gas in a direction perpendicular to a substrate or a side flow type gas supply unit configured to supply reaction gas in a direction parallel with a substrate.

The first stepped shape of the substrate holder 750 may include a first upper step US1 and a first lower step LS1 having a height different from that of the first upper step US1. In addition, the second stepped shape of the reactor wall W may include a second upper step US2 and a second lower step LS2 having a height different from that of the second upper step US2. In this case, during face sealing, a space may be formed between the first upper step US1 and the second lower step LS2 (and between the first lower step LS1 and the second upper step US2).

When the substrate holder 750 is lift by a driving unit and brought into face-sealing contact with the reactor wall W, the space may function as a margin preventing the first upper step US1 of the first stepped shape from overlapping the second lower step LS2 of the second stepped shape.

In addition, the space may function as a sliding space allowing the reactor wall W to slide when the reactor wall W is moved or deformed, downward as a top lid is deformed and/or the reactor wall W is heated.

For example, if the center of gravity of the top lid is at the center of the outer chamber, when the reactor wall W is moved or deformed downward, the reactor wall may bend inward toward the reaction region R. Thus, the substrate holder 750 having elasticity may bend downward as the reactor wall W bends inward. In this case, the reactor wall W may slide in the space toward a stepped portion of the substrate holder 750 (between the first lower step LS1 and the first upper step US1).

Figure 8:
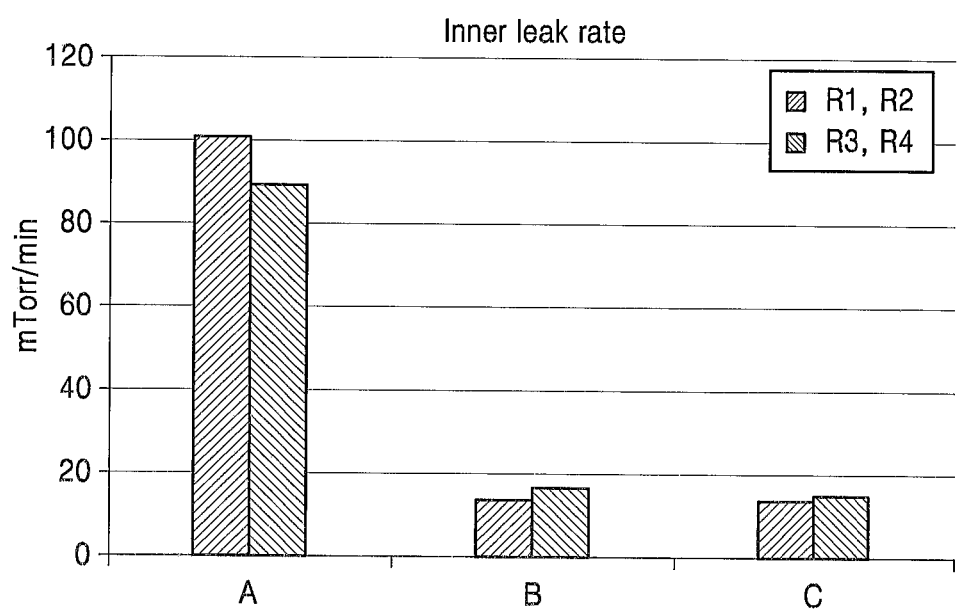
FIG. 8 is a graph showing experimental results obtained by measuring an increase of the pressure of an outer chamber according to the use of the substrate holder illustrated in FIGS. 5A to 5D.
Figure 9:
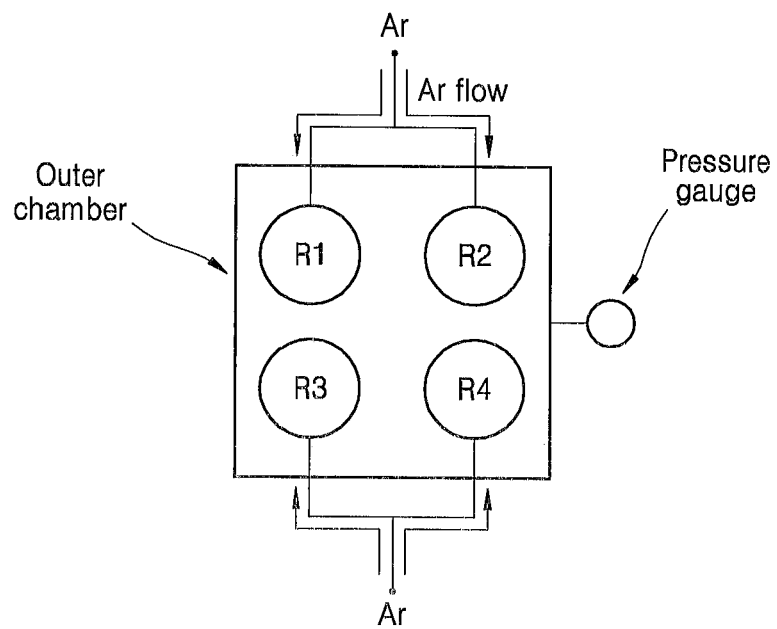
FIG. 9 is a view illustrating how the experiment illustrated in FIG. 8 was performed to measure an increase of the pressure of the outer chamber.

FIG. 8 is a graph showing experimental results obtained by measuring an increase of the pressure of an outer chamber according to the use of the substrate holder 550 described with reference to FIGS. 5A to 5D. In the experiment, four reactors were arranged in the outer chamber, and a pressure increase in the outer chamber was measured using a pressure gauge while simultaneously supplying argon (Ar) gas to two reactors and then to the other two reactors. In detail, as shown in FIG. 9, the pressure of the outer chamber was measured using the pressure gauge while simultaneously supply argon (Ar) gas to reactors R1 and R2, and then, the pressure of the outer chamber was measured using the pressure gauge while simultaneously supplying argon (Ar) gas to reactors R3 and R4.

In FIG. 8, "A" refers to gas leakage from the reactors R1, R2, R3, and R4 to the outer chamber at room temperature when substrate holders of the related art were used (that is, substrate holders not including recess regions imparting elasticity to the substrate holders when pressure is applied during face sealing). In this case, all of the four reactors R1, R2, R3, and R4 had a high gas leak rate within a range of 80 mTorr/min or greater.

"B" and "C" refer to gas leakage from the reactors R1, R2, R3, and R4 to the outer chamber at room temperature ("B") and 300° C. ("C") when substrate holders of the inventive concept (identical to the substrate holder 550 illustrated in FIGS. 5A to 5D) were used.

When the substrate holders of the inventive concept (identical to the substrate holder 550 illustrated in FIG. 5A to 5D) were used, compared to the gas leak rate in the case "A," all of the four reactors R1, R2, R3, and R4 had a markedly reduced gas leak rate within a range of 20 mTorr/min or less. As shown in the cases "B" (room temperature) and "C" (300° C.), the gas leakage could be constantly managed regardless of temperature.

In general, the deformation of a top lid increases as temperature increases. However, when the substrate holders of the inventive concept were used, a process could be stably performed even though a top lid deformed at high temperature as in the case "C" in FIG. 8.

Figure 10:
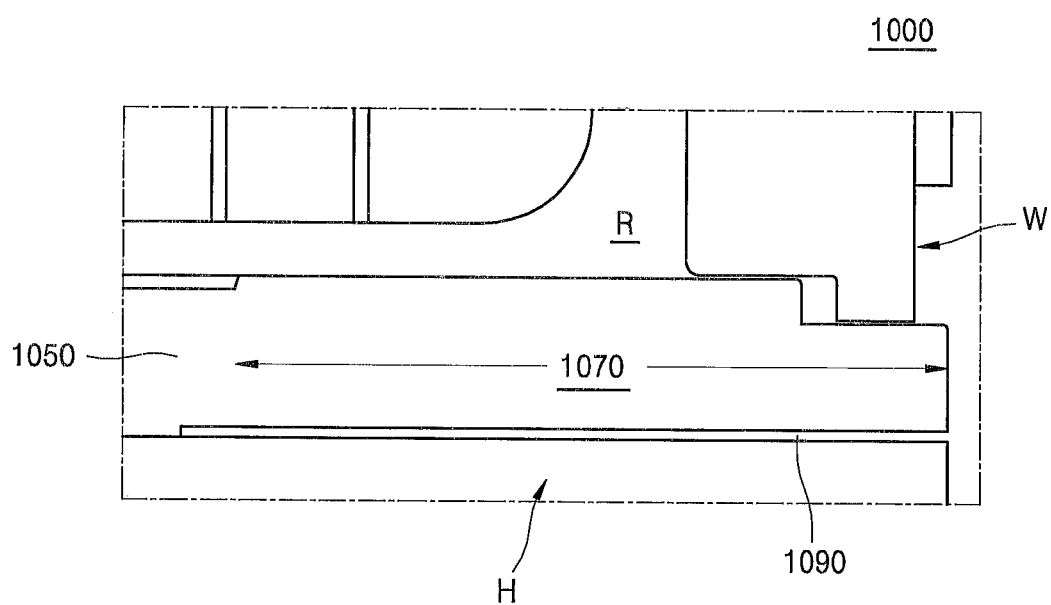
FIG. 10 is a schematic view illustrating a substrate holder and a semiconductor manufacturing apparatus including the substrate holder according to another embodiment.

FIG. 10 is a schematic view illustrating a substrate holder 1050 and a semiconductor manufacturing apparatus 1000 including the substrate holder 1050 according to another embodiment. The substrate holder 1050 of the current embodiment may be a modification of the substrate holders of the previous embodiments. Thus, repeated descriptions of the same elements will be omitted.

Referring to FIG. 10, a recess region 1090 for providing elasticity may be formed in a lower portion of a stepped portion 1070, that is, between the substrate holder 1050 and a heater H. The recess region 1090 may extend along the lower portion of the stepped portion 1070. The recess region 1090 may have a width greater than a width of the stepped portion 1070. In addition; the recess region 1090 may extend into a region overlapping a reaction region R.

For example, the substrate holder 1050 may be a susceptor, and the recess region 1090 may have a stepped shape. As illustrated in FIG. 5, the stepped shape may have a length greater than a length measured from an edge of the susceptor to an edge of an upper step of the susceptor (that is, the stepped shape may overlap the reaction region R). Therefore, even though a reactor wall W is deformed while making contact with the susceptor, the susceptor may flexibly absorb pressure applied by the reactor wall W.

Figure 11:
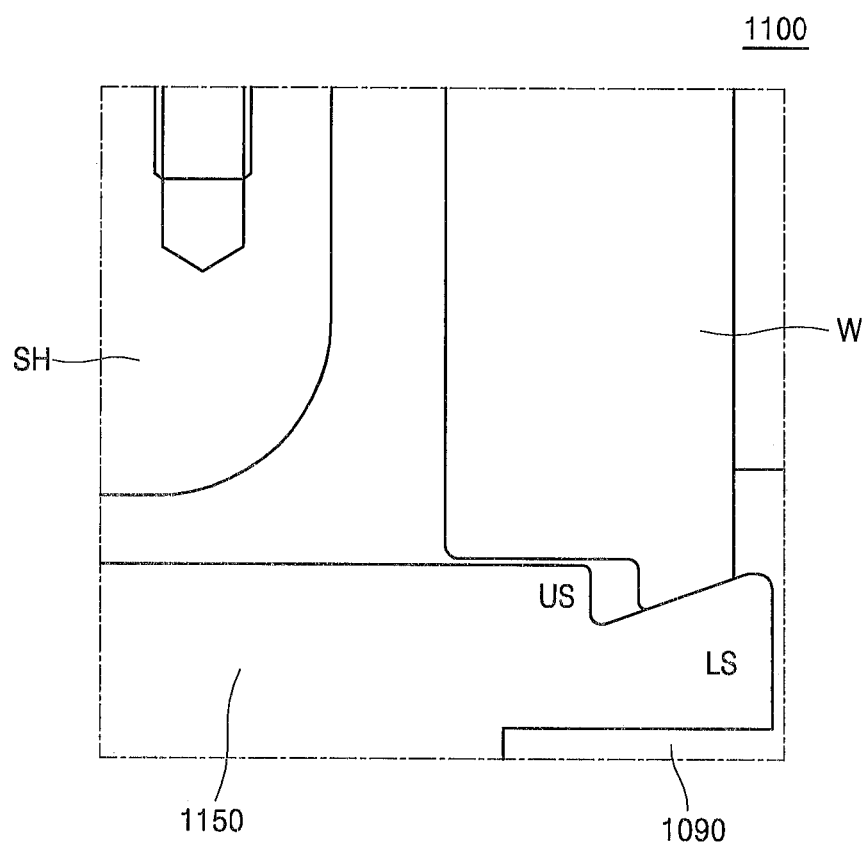
FIG. 11 is a schematic view illustrating a substrate holder and a semiconductor manufacturing apparatus including the substrate holder according to another embodiment.

FIG. 11 is a schematic view illustrating a substrate holder 1150 and a semiconductor manufacturing apparatus 1100 including the substrate holder 1150 according to another embodiment. The substrate holder 1150 of the current embodiment may be a modification of the substrate holders of the previous embodiments. Thus, repeated descriptions of the same elements will be omitted.

Referring to FIG. 11, unlike the lower step LS of the substrate holder 550 illustrated in FIGS. 5A to 5D, an upper surface of a lower step LS may not be parallel with a direction in which a groove 1190 extends. For example, the upper surface of the lower step LS may extend in an inclined direction inclined toward an extended surface of an upper surface of an upper step US from a position at which the upper surface of the lower step LS is stepped from the upper step US.

A space may be formed between a lateral side of the upper step US of the substrate holder 1150 and a reactor wall W (and between the upper surface of the lower step LS and the reactor wall W).

As described above, the space may prevent the substrate holder 1150 from colliding with the reactor wall W and function as a sliding space. For example, in an outer chamber in which a plurality of reactors are arranged as illustrated in FIG. 3, if a top lid is deformed downward because of its weight, a reactor wall may be vertically lowered (in a direction perpendicular to the substrate holder 1150 or a heater). In this case, if the reactor wall is horizontally brought into contact with the substrate holder (refer to FIG. 7), the top lid and the reactor wall may be deformed, and thus a gas leakage path may be formed between the reactor wall and the substrate holder.

However, in the case of the substrate holder 1150 illustrated in FIG. 11, a stepped surface formed on a susceptor edge portion (that is, the upper surface of the lower step LS) is inclined. Therefore, although the reactor wall W is moved downward by the deformation of the top lid, the reactor wall W may smoothly slide along a contact surface with the substrate holder 1150. That is, although an outer chamber (and the reactor wall) is deformed, contact between the substrate holder 1150 and the reactor wall W may be maintained.

FIGS. 12 to 19 are schematic views illustrating substrate holders and semiconductor manufacturing apparatuses including the substrate holders according to other embodiments. The substrate holders of the embodiments of FIGS. 12 to 19 may be modifications of the substrate holders and the semiconductor manufacturing apparatuses of the previous embodiments. Thus, repeated descriptions of the same elements will be omitted.

Figure 12:
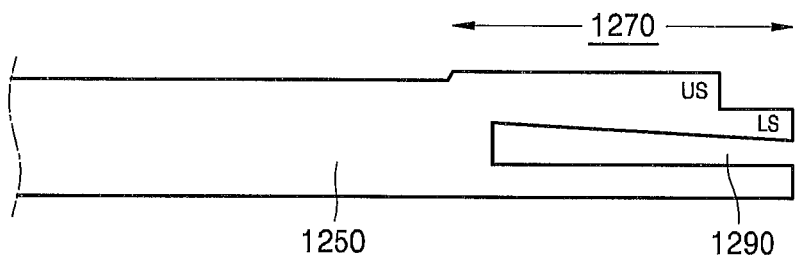
FIGS. 12 to 19 are schematic views illustrating substrate holders and semiconductor manufacturing apparatuses including the substrate holders according to other embodiments.

Referring to FIG. 12, a recess region 1290 having elasticity may include a groove extending into a lateral side of a stepped portion 1270 in a direction not parallel with a surface of the stepped portion 1270 (for example, in a direction not parallel with an upper surface of an upper step US and/or an upper surface of a lower step LS). For example, an upper surface of the groove may extend in a direction from the lateral side toward an upper side of the stepped portion 1270.

Figure 13:
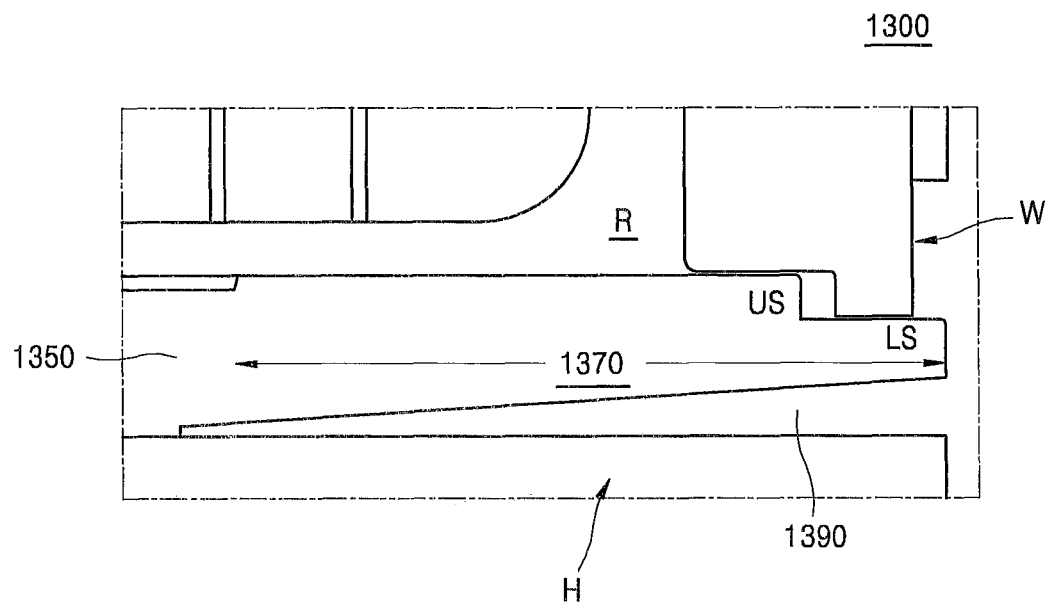

Referring to FIG. 13, a recess region 1390 having elasticity may extend along a lower portion of a stepped portion 1370 in a direction not parallel with a surface of the stepped portion 1370 (for example, in a direction not parallel with an upper surface of an upper step US and/or an upper surface of a lower step LS). For example, the recess region 1390 may extend in a direction from a lateral side of the stepped portion 1370 toward a heater H.

Figure 14:
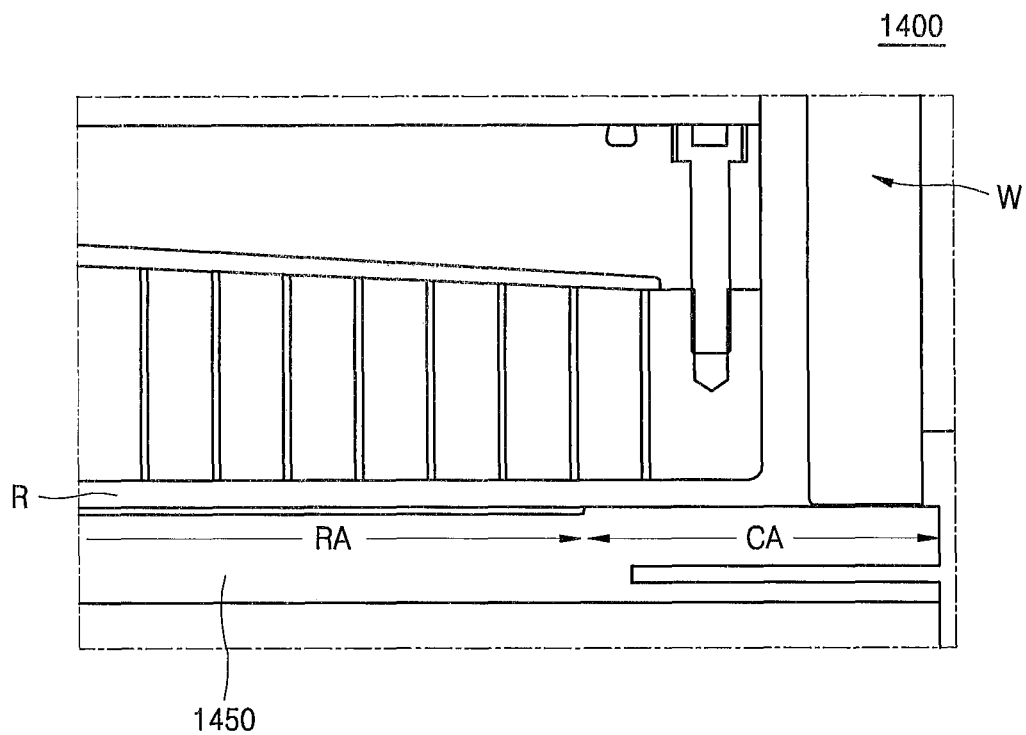

Referring to FIG. 14, a substrate holder 1450 and a reactor wall W may not include a stepped portion. That is, an upper side of the substrate holder 1450 may include a substrate accommodation region RA and a contact region CA, and at least a portion of the contact region CA may have an elastic behavior when pressure is applied thereto as the reactor wall W is brought into face-sealing contact with the contact region CA. To this end, a lateral side of the contact region CA may be recessed.

Figure 15:
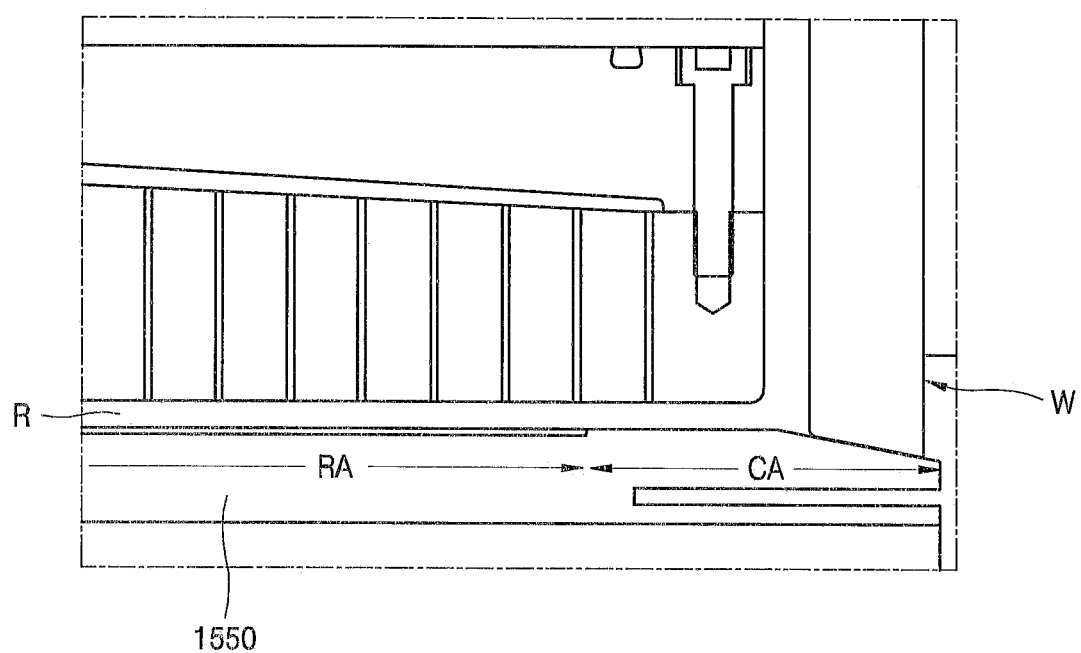
Figure 16:
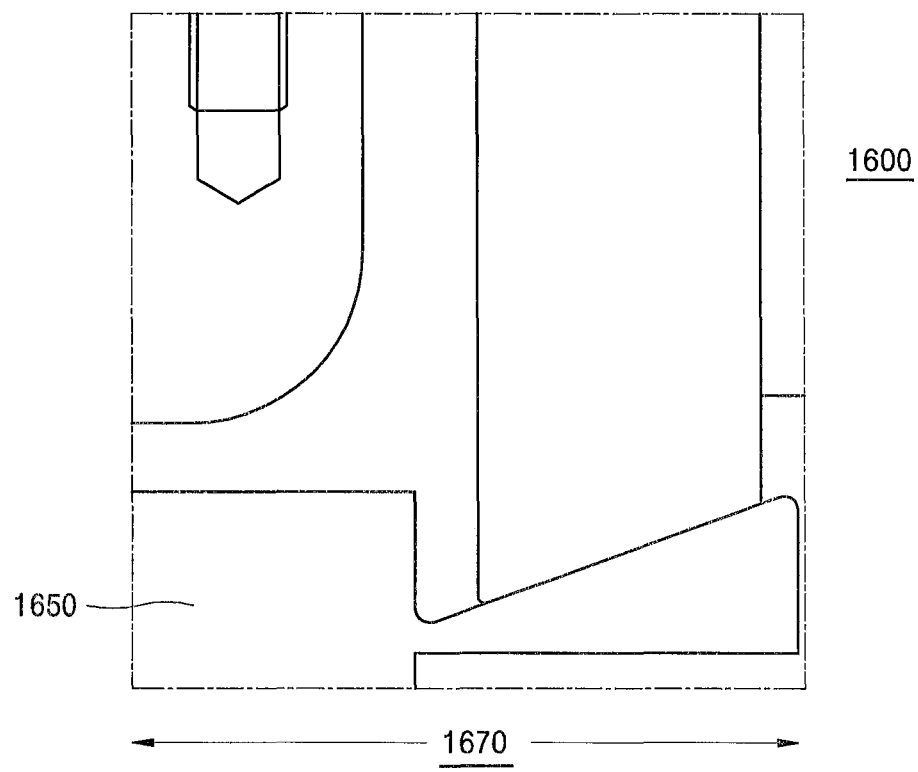

Referring to FIGS. 15 and 16, substrate holders 1550 and 1650 and reactor walls W have inclined surfaces, respectively, and thus, face sealing is realized as the inclined surfaces are brought into contact with each other. Referring to FIG. 15, the substrate holder 1550 and the reactor wall W of a semiconductor manufacturing apparatus 1500 may not include a stepped portion. Referring to a semiconductor manufacturing apparatus 1600 of FIG. 16, the substrate holder 1650 may include a stepped portion 1670 and the reactor wall W may not include a stepped portion.

A lower portion of a contact region CA (refer to FIG. 15) or the stepped portion 1670 (refer to FIG. 16) is recessed, and thus, the substrate holders 1550 and 1650 may flexibly absorb pressure when brought into face-sealing contact with the reactor walls W. In addition, although the reactor walls W are moved downward by deformation of an outer chamber (and a top lid), the reactor walls W may smoothly slide on contact surfaces with the substrate holders 1550 and 1650.

Figure 17:
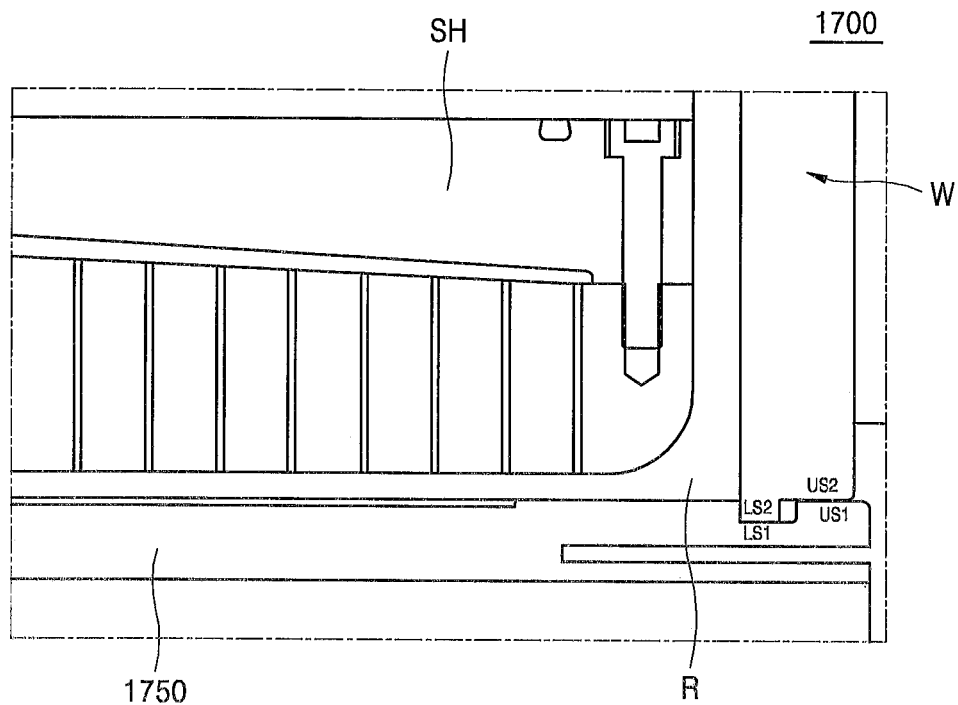

Referring to FIG. 17, a first stepped shape of a substrate holder 1750 may include a first upper step US1 and a first lower step LS1 having a height different from that of the first upper step US1. In addition, a second stepped shape of a reactor wall W may include a second upper step US2 and a second lower step LS2 having a height different from that of the second upper step US2. In this case, when the substrate holder 1750 makes face-sealing contact with the reactor wall W, a space may be formed between the first upper step US1 and the second lower step LS2 (and between the first lower step LS1 and the second upper step US2).

For example, when a temperature of a reaction region R is high, a temperature of an inner surface of the reactor wall W (the inner surface facing the reaction region R) may be higher than a temperature of an outer surface of the reactor wall W (the outer surface facing a center region of an outer chamber). In this case, the amount of thermal expansion of the reactor wall W may be larger at the inner surface than at the outer surface. Therefore, when the reactor wall W is moved or deformed downward, the reactor wall W may bend in a direction away from the reaction region R. In this case, the substrate holder 1750 having elasticity may bend downward as the reactor wall W bends outward, and the reactor wall W may slid in a direction reducing the space.

Figure 18:
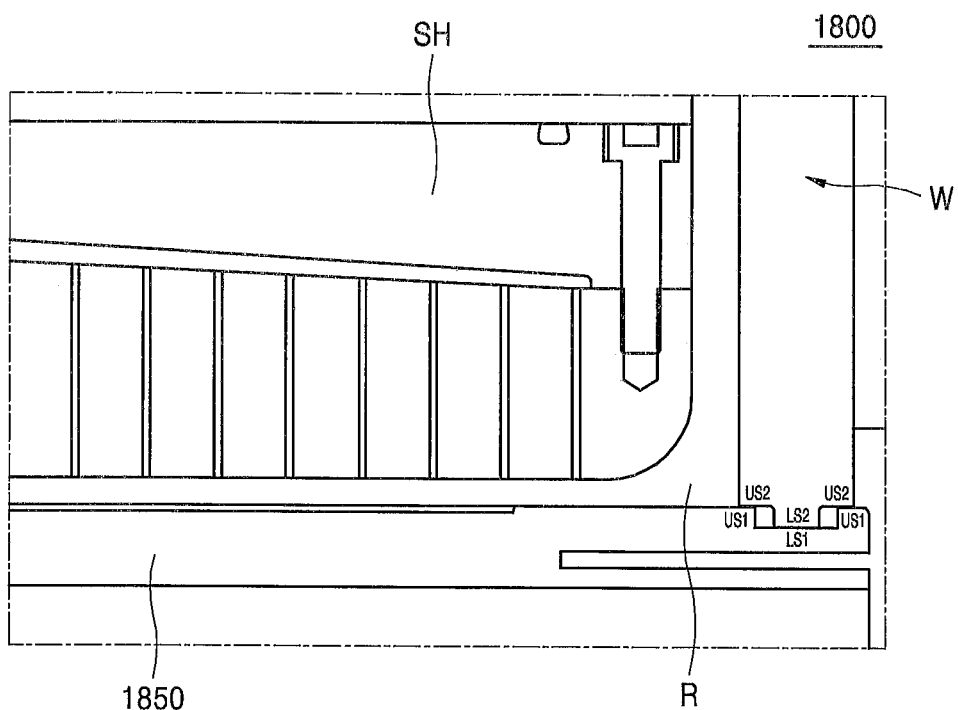

Referring to FIG. 18, a first stepped shape of a substrate holder 1850 may include first upper steps US1 and a first lower step LS1 having a height different from that of the first upper steps US1. In addition, a second stepped shape of a reactor wall W may include second upper steps US2 and a second lower step LS2 having a height different from that of the second upper steps US2. In this case, when the substrate holder 1850 makes face-sealing contact with the reactor wall W, spaces may be formed between the first upper steps US1 and the second lower step LS2 (and between the first lower step LS1 and the second upper steps US2).

A semiconductor manufacturing apparatus 1800 illustrated in FIG. 18 may form sliding spaces for both the case in which the center of gravity of a top lid (and the center of gravity of a gas supply unit SH) is at the center of an outer chamber (that is, the case in which the reactor wall W tends to bend inward toward a reaction region R as described with reference to FIG. 7) and the case in which the temperature of the reaction region R is high (that is, the case in which the reactor wall W tends to bend outward from the reaction region R as described with reference to FIG. 17).

The deformation of the reactor wall W described with reference to FIGS. 7 and 18 is based on the case in which the reactor wall W is adjacent to the center of an outer chamber.

Figure 19:
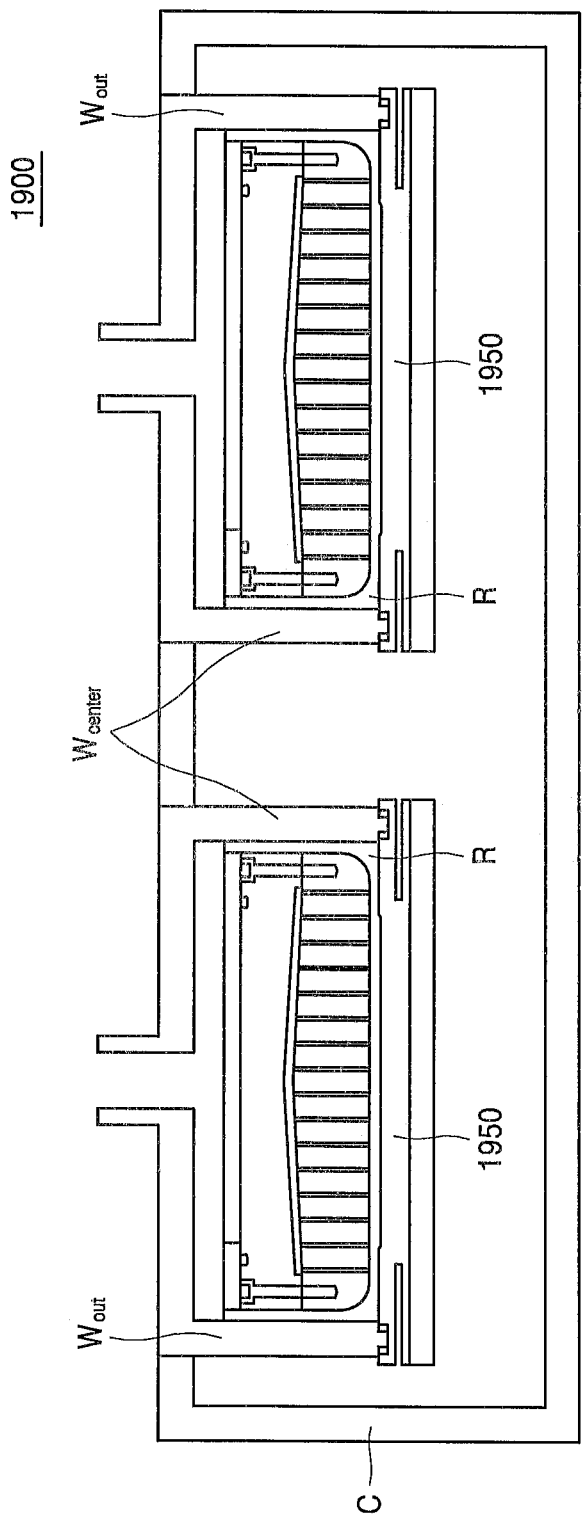

Referring to FIG. 19, under the same conditions, a reactor wall $W_{out}$ adjacent to an outer wall of an outer chamber C may bend in a direction opposite the bending direction of a reactor walls $W_{center}$ adjacent to the center of the outer chamber C (that is, the reactor walls $W_{out}$ and $W_{center}$ may bend asymmetrically). For example, if the center of gravity of a top lid is at the center of the outer chamber C, the reactor wall $W_{center}$ adjacent to the center of the outer chamber C may bend inward toward a reaction region R, and the reactor wall $W_{out}$ adjacent to the outer wall of the outer chamber C may bend outward from the reaction region R. Referring to FIG. 19, substrate holders 1950 and a semiconductor manufacturing apparatus 1900 including the substrate holders 1950 may form sliding spaces for the above-mentioned case (that is, for the case in which reactor walls are asymmetrically deformed), thereby preventing gas leakage.

FIGS. 20 to 25 are schematic views illustrating a substrate holder according to other embodiments. The substrate holders of the embodiments of FIGS. 20 to 25 may be modifications of the substrate holders of the previous embodiments. Thus, repeated descriptions of the same elements will be omitted.

Figure 20:
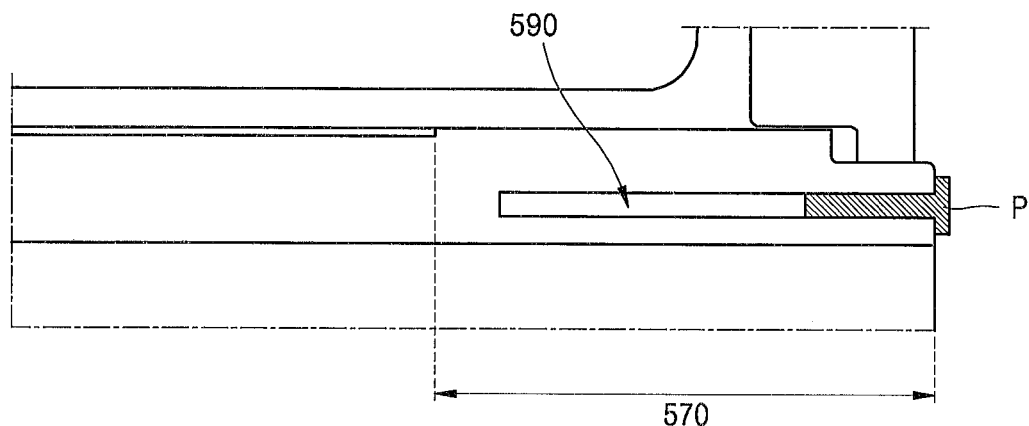
FIGS. 20 to 25 are schematic views illustrating a substrate holder according to other embodiments.

Referring to FIG. 20, a substrate holder may further include at least one prop P. The at least one prop P may have a plurality of props P, and the props P may be placed in a recess region 590. When the recess region 590 is formed in a lateral side of the substrate holder, the props P may be used. That is, the props P may fill at least portions of a groove extending inward from the lateral side of the substrate holder.

The props P may prevent thermal deformation of an internal space such as the recess region 590 of the substrate holder. When a semiconductor manufacturing apparatus is operated at a high temperature (for example, 300° C. or higher), a reactor wall W and/or the substrate holder may be deformed (for example, due to thermal expansion). In this case, a stepped portion 570 of the substrate holder may be deformed, and gas may leak between contact surfaces of the reactor wall W and the stepped portion 570. As a result, a film formed by a deposition process may have poor thickness uniformity.

However, according to the embodiments, the props P are placed in the groove formed in the lateral side of the substrate holder. Thus, although the reactor wall W and/or the substrate holder are deformed during a high-temperature process, the deformation of the stepped portion 570 may be suppressed. That is, flexibility is imparted to the substrate holder by forming the groove in the substrate holder, and deformation of the substrate holder is suppressed using the props P during a high-temperature process, thereby guaranteeing thickness uniformity within a wide temperature range.

The props P may be variously shaped. In FIG. 20, the props P have a T-shape so that a stepped portion may be formed between an insertion portion and a non-insertion portion of each prop P. However, the shape of the props P is not limited thereto. For example, the props P may have an I-shape and may be entirely insertable into the recess region 590. In another example, insertion portions of the props P may have a circular sectional shape instead of having a tetragonal sectional shape.

Figure 21:
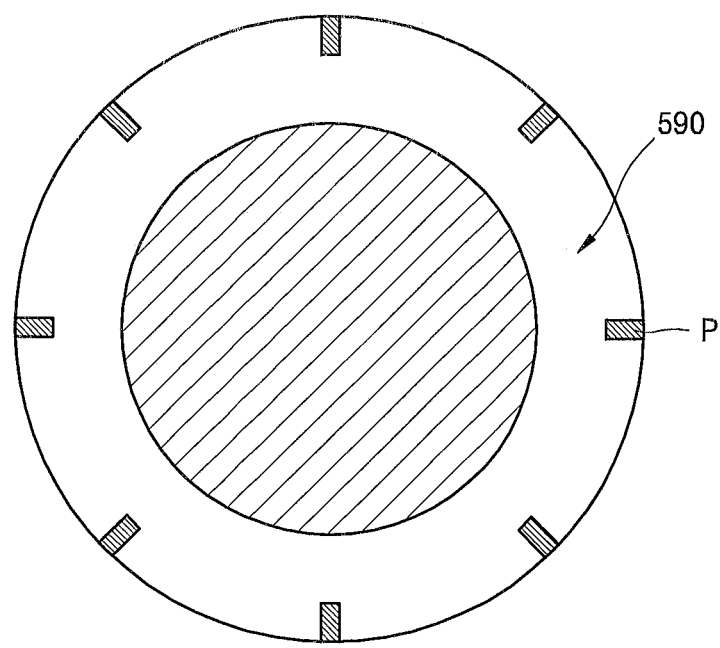

In addition, referring to FIG. 21 illustrating a horizontal section of a substrate holder, a plurality of tips may be partially arranged in an end region of a recess region 590 as props P. At least one of the material, thickness, width, number, and insertion depth of the tips may be adjusted to obtain the above-described effects (thermal deformation prevention and internal gas leakage prevention).

Figure 22:
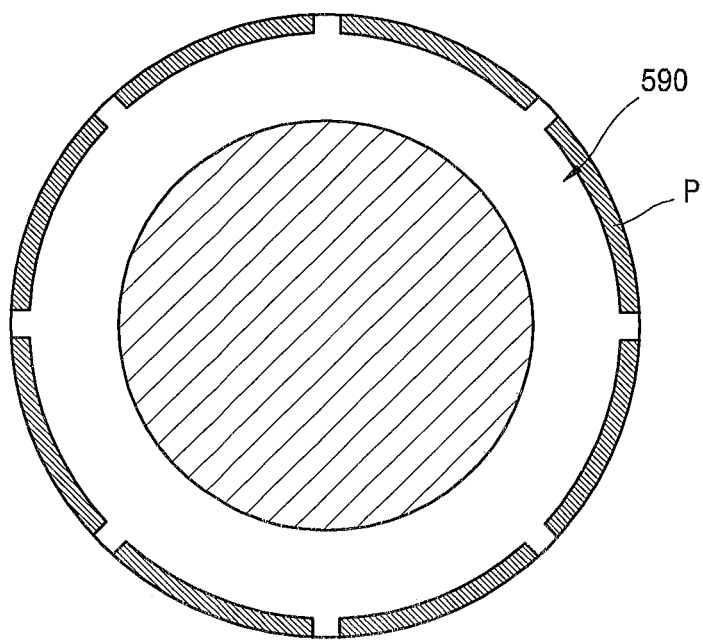

In addition, referring to FIG. 22 illustrating a horizontal section of the substrate holder, a rim surrounding the circumference of the recess region 590 may be provided. Like the tips, at least one of the material, thickness, width, number (that is, the number of rim parts), and insertion depth of the rim may be adjusted to obtain the above-described effects.

Figure 23:
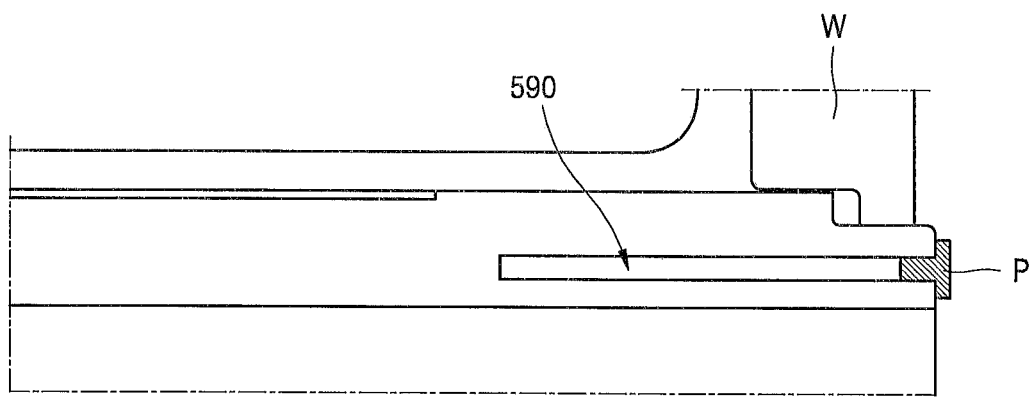

FIG. 23 illustrates an example in which the insertion depth of tips and/or a rim is adjusted. As illustrated in FIG. 23, the insertion depth of the props P may be adjusted so as to prevent deformation of the substrate holder and gas leakage during a high-temperature process while guaranteeing the flexibility of the substrate holder by the recess region 590. For example, the insertion depth of the props P may not reach a middle point of a lower step of the reactor wall W. In another example, the insertion depth of the props P may be smaller than half of the width of the lower step of the reactor wall W.

The props P may include a material having a thermal expansion coefficient lower than the thermal expansion coefficient of the substrate holder (particularly, the stepped portion 570 of the substrate holder). For example, if the substrate holder includes aluminum having a thermal expansion coefficient of $24 \times 10^{-6}/°$ C., the props P may include a material (for example, a metallic material or a ceramic material) having a thermal expansion coefficient lower than that of aluminum. Since the props P have a relatively low thermal expansion coefficient, the props P may be deformed less than the reactor wall W and/or the substrate holder during a high-temperature process, and thus the deformation of the stepped portion 570 may be suppressed by the props P.

Figure 24:
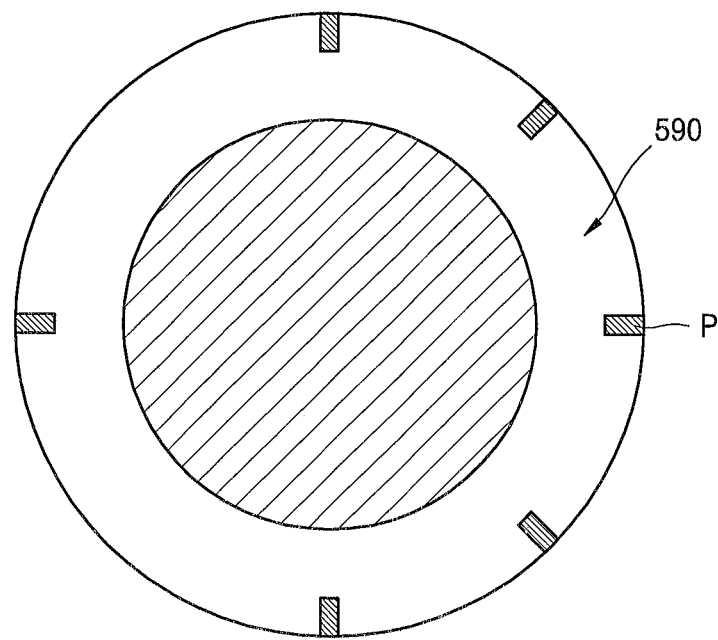

In addition, the prop P may be asymmetrically arranged along the circumference of the substrate holder. For example, as illustrated in FIG. 24, a prop P may be placed in a region (left region) of the substrate holder, and three props P may be arranged in the other region (right region) of the substrate holder. This structure may be useful for a chamber in which a plurality of reactors are arranged. For example, during a high-temperature process, the temperature of the reactor wall W may be higher in a region adjacent to a center region of an outer chamber than in a region adjacent to an outer region of the outer chamber. In this case, if the props P are asymmetrically arranged (that is, if the props P are arranged more densely in a portion of the recess region 590 adjacent to the center region of the outer chamber than in a portion of the recess region 590 adjacent to the outer region of the outer chamber), the deformation of the recess region 590 may be uniformly suppressed.

The expression "the props P are asymmetrically arranged" is not only related to the number of the props P. The arrangement shown in FIG. 24 is a non-limiting arrangement example related to the number of the props P. That is, at least one of the material, number, thickness, width, and insertion depth of the props P may be asymmetrically provided.

Figure 25:
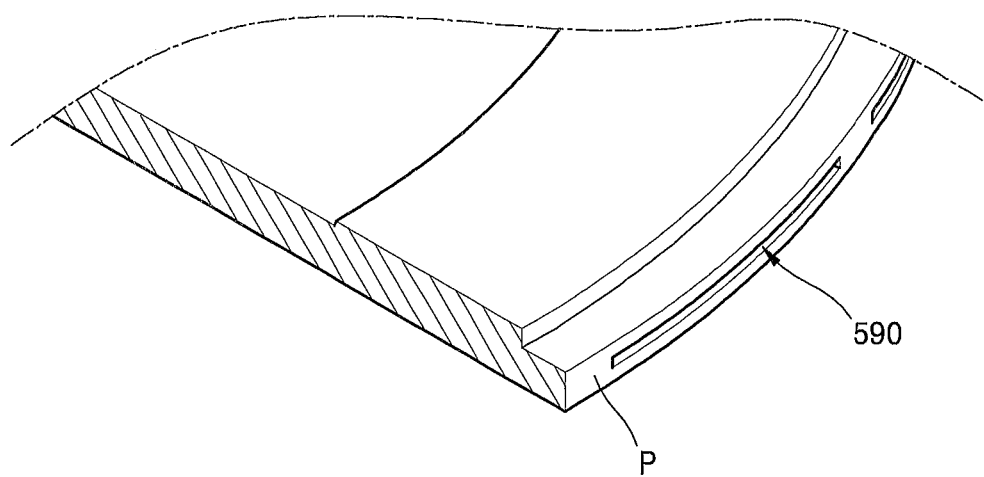

According to an embodiment, the props P may include the same material as that included in the substrate holder as illustrated in FIG. 25. That is, when the substrate holder is machined, the recess region 590 may not be formed along the entire circumference of the substrate holder. Instead, recess regions 590 may be partially formed along the circumference of the substrate holder, and thus portions in which the recess regions 590 are not formed may function as props P.

As described above, according to the one or more of the above embodiments, gas leakage through a face-sealing region between a reactor wall and a substrate holder may be reduced or prevented. For example, although a chamber in which multiple reactors are arranged is deformed by the weight of an upper portion of the chamber, processes that take place in the chamber may be less affected by the deformation of the chamber, and thus, the multiple reactors may be effectively managed.

In addition, according to the one or more of the embodiments, processes may be less affected by the deformation of multiple reactors at room temperature and even at high temperatures at which the deformation of the multiple reactors increases.

The shapes of parts illustrated in the accompanying drawings are examples provided for clear understanding of the embodiments. That is, the shapes of parts may be varied.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the inventive concept as defined by the following claims.

What is claimed is:

1. A substrate holder comprising:
   a substrate rest configured to support a substrate; and
   a stepped portion surrounding the substrate rest when viewed from over the substrate rest,
   wherein a lateral side of the stepped portion comprises a recess region, wherein a groove extending from the lateral side toward the substrate is provided, in a cross-sectional view of the substrate holder, between an upper portion and a lower portion of the recess region of the stepped portion, and
   wherein the substrate holder further comprises:
   at least one prop inserted into the groove such that at least one prop is in direct physical contact with and vertically overlaps the upper portion and the lower portion of the recess region of the stepped portion, wherein the at least one prop is formed of a material different from and has a thermal expansion coefficient lower than that of the stepped portion to prevent or suppress a thermal deformation of the recess region during a heat processing of the substrate, wherein the at least one prop includes a head disposed outside the groove and a body extending from the head and disposed inside the groove, wherein the body has an outer surface in direct physical contact with the upper portion and the lower portion of the recess region of the stepped portion, and wherein the body does not contact an inner end of the groove.

2. The substrate holder of claim 1, wherein the stepped portion comprises an upper step and a lower step having a height different from a height of the upper step, and
   wherein the groove has a width greater than a width of the lower step.

3. The substrate holder of claim 2, wherein an upper surface of the lower step extends in a direction parallel with a direction in which the groove extends.

4. The substrate holder of claim 2, wherein an upper surface of the lower step extends in a direction not parallel with a direction in which the groove extends.

5. The substrate holder of claim 4, wherein the upper surface of the lower step extends in an inclined direction toward an extended surface of an upper surface of the upper step from a position at which the upper surface of the lower step is stepped from the upper step.

6. The substrate holder of claim 1, further comprising an elastic material filled in at least a portion of the gap.

7. The substrate holder of claim 1, wherein the at least one prop fills a portion of the groove, and a material different from the at least one prop fills another portion of the groove, and
wherein the material is disposed between a center of the substrate holder and the at least one prop.

8. The substrate holder of claim 7, wherein the at least one prop has a plurality of props, and wherein the plurality of props are asymmetrically arranged along a circumference of the substrate holder.

9. A semiconductor manufacturing apparatus comprising:
a reactor wall;
a substrate holder configured to make face-sealing contact and define a reaction region with the reactor wall, the substrate holder comprising a substrate rest configured to support a substrate and a stepped portion surrounding the substrate rest; and
a gas supply unit configured to supply gas to the reaction region,
wherein a lateral side of the stepped portion comprises a recess region, wherein a groove extending from the lateral side toward the substrate is provided, in a cross-sectional view of the substrate holder, between an upper portion and a lower portion of the recess region of the stepped portion,
wherein the substrate holder has an elastic behavior when pressure is applied thereto during the face-sealing contact, and
wherein the substrate holder further comprises:
at least one prop inserted into the groove such that at least one prop is in direct physical contact with and vertically overlaps the upper portion and the lower portion of the recess region of the stepped portion, wherein the at least one prop is formed of a material different from and has a thermal expansion coefficient lower than that of the stepped portion to prevent or suppress deformation of the recess region during a heat processing of the substrate, wherein the at least one prop includes a head disposed outside the groove and a body extending from the head and disposed inside the groove, wherein the body has an outer surface in direct physical contact with the upper portion and the lower portion of the recess region of the stepped portion, and wherein the body does not contact an inner end of the groove.

10. The semiconductor manufacturing apparatus of claim 9, wherein a space is formed between the substrate holder and the reactor wall during the face-sealing contact.

11. The semiconductor manufacturing apparatus of claim 10, wherein at least a portion of the substrate holder comprises an upper step and a lower step having a height different from a height of the upper step, and
wherein the space is formed between the upper step and the reactor wall during the face-sealing contact.

12. The semiconductor manufacturing apparatus of claim 9, further comprising an outer chamber surrounding the reactor wall,
wherein the pressure applied to the substrate holder during the face sealing contact is generated by the outer chamber.

13. The semiconductor manufacturing apparatus of claim 9, wherein the substrate holder comprises a groove extending into a lateral side of the substrate holder.

14. The semiconductor manufacturing apparatus of claim 13, wherein the groove extends into a region overlapping the reaction region.

15. The semiconductor manufacturing apparatus of claim 9, wherein a lower portion of the substrate holder has a stepped shape.

16. The semiconductor manufacturing apparatus of claim 15, wherein the stepped shape extends into a region overlapping the reaction region.

17. A semiconductor manufacturing apparatus comprising:
a first reactor wall;
a second reactor wall;
a gas supply unit configured to supply gas to a region inside the first reactor wall and a region inside the second reactor wall;
an outer chamber surrounding the first reactor wall and the second reactor wall;
a first substrate holder configured to move vertically make face-sealing contact with the first reactor wall; and
a second substrate holder configured to move vertically and make face-sealing contact with the second reactor wall,
wherein at least one of the first and second substrate holders comprises a substrate rest configured to support a substrate and a stepped portion surrounding the substrate rest,
wherein a lateral side of the stepped portion comprises a recess region having an elastic behavior when pressure is applied thereto by the outer chamber during the face-sealing contact, wherein a groove extending from the lateral side toward the substrate is provided, in a cross-sectional view of the substrate holder, between an upper portion and a lower portion of the recess region of the stepped portion, and
wherein at least one of the first substrate holder and the second substrate holder further comprises:
at least one prop inserted into the groove such that at least one prop is in direct physical contact with and vertically overlaps the upper portion and the lower portion of the recess region of the stepped portion, wherein the at least one prop is formed of a material different from and has a thermal expansion coefficient lower than that of the stepped portion to prevent or suppress deformation of the recess region during a heat processing of the substrate, wherein the at least one prop includes a head disposed outside the groove and a body extending from the head and disposed inside the groove, wherein the body has an outer surface in direct physical contact with the upper portion and the lower portion of the recess region of the stepped portion, and wherein the body does not contact an inner end of the groove.

18. The substrate holder of claim 1, wherein the at least one prop is formed of a metallic material or a ceramic material, and wherein the stepped portion is formed of aluminum.

19. The substrate holder of claim 1, wherein the at least one prop is configured to be deformed less than the stepped portion during the heat processing of the substrate.

* * * * *